(12) United States Patent
Chatelain

(10) Patent No.: US 6,288,549 B1
(45) Date of Patent: Sep. 11, 2001

(54) UNINTERRUPTIBLE POWER SUPPLY MODULAR BATTERY TEST PANEL

(76) Inventor: Greg Chatelain, 20500 Jackson St., Covington, LA (US) 70345

( * ) Notice: Subject to any disclaimer, the term of this patent is extended or adjusted under 35 U.S.C. 154(b) by 0 days.

(21) Appl. No.: 09/593,909

(22) Filed: Jun. 14, 2000

(51) Int. Cl.[7] .................................................. G01N 27/416
(52) U.S. Cl. ............................................. 324/426; 324/434
(58) Field of Search ..................................... 324/426, 430, 324/433, 434

(56) References Cited

U.S. PATENT DOCUMENTS

| | | | |
|---|---|---|---|
| 3,939,400 | 2/1976 | Steele | 324/29.5 |
| 4,147,969 | 4/1979 | Miller et al. | 320/2 |
| 4,707,795 | 11/1987 | Alber et al. | 364/550 |
| 5,376,887 | 12/1994 | Saubolle | 324/433 |
| 5,418,403 | 5/1995 | Morell, III | 307/72 |
| 5,872,831 | 2/1999 | Zoiss et al. | 379/21 |
| 5,903,154 | 5/1999 | Zhang et al. | 324/437 |
| 5,914,609 | 6/1999 | Curry et al. | 324/601 |
| 6,037,778 | 3/2000 | Makhija | 324/433 |

*Primary Examiner*—Edward H. Tso
(74) *Attorney, Agent, or Firm*—Robert Lev

(57) ABSTRACT

A battery bank in an enclosed battery compartment is provided with subsidiary connectors that run from the battery compartment to an external test panel. Subsidiary connectors from each of the batteries connect to test jacks on the test panel so that each battery can be individually tested by an external test device without exposing the operator to danger by opening the battery compartment doors. Besides increased safety, the benefit is a faster, more convenient test process that facilitates greater timeliness in testing and maintenance, an especially important feature in an uninterruptible power supply.

5 Claims, 1 Drawing Sheet

UNINTERRUPTIBLE POWER SUPPLY MODULAR BATTERY TEST PANEL

FIELD OF THE INVENTION

The present invention is generally related to the maintenance of uninterruptible power supplies (UPS). In particular, the present invention is directed to an improved battery to test system.

BACKGROUND ART

Uninterruptible power supply (UPS) are used in a variety of different environments in which an interruption of power due to the variations or loss of the primary power source is unacceptable. Since reliability is a chief attribute required of such systems, constant maintenance is required. In particular, the batteries that constitute a major portion of a UPS must be constantly checked to make certain that battery banks (which is usually connected in series) have no bad batteries and that the overall load performance of the entire battery tank was at acceptable levels.

Conventionally, the only way to check the battery bank and perform load tests is to physically open up the battery compartment of the UPS unit and place test leads directly on each of the individual batteries located within the main battery compartment. This procedure is very dangerous and has resulted in numerous instances of high voltage arcing with accompanying shock injury to individuals, as well as damage to the equipment.

There are no techniques or systems that avoid these hazards in the conventional art. Accordingly, any user of a UPS would greatly benefit from a test system that would permit safe and fast testing of individual batteries in the UPS.

SUMMARY OF THE INVENTION

Accordingly, it is one object of the present invention to overcome the drawbacks of the conventional technology in the testing of battery banks.

It is another object of the present invention to provide a system for testing voltage and load on batteries in a bank while avoiding high voltage hazards.

It is a further object of the present invention to provide a system for testing batteries in a bank in a UPS where the battery testing can be carried out without entering the battery bank cabinet.

It is an additional object of the present invention to provide a system for measuring individual batteries in a battery bank where only low voltage equipment is required.

It is again another object of the present invention to provide a battery testing system that can be operated under less than ideal conditions with respect to space and light.

It is still a further object of the present invention to provide a battery testing system that can be used with sufficient frequency so that battery bank failures can easily be predicted.

It is yet another object of the present invention to provide a battery testing system that is simple to operate, and has very few parts.

It is again a further object of the present invention to provide a battery testing system that is low in cost.

It is still an additional object of the present invention to provide a battery testing system wherein each battery can be loaded with a relatively high artificial load while observing voltage drops at realistic operating conditions.

It is again another object of the present invention to provide battery testing system in which either a single battery or multiple batteries within a battery bank can be monitored safely.

These and other goals and objects of the present invention are achieved by a battery test system arranged for testing a bank of batteries, where the bank of batteries is constituted by at least two batteries. The batteries are connected in series with main connectors. Also included on each of the batteries is a set of subsidiary connectors located on positive and negative terminals of each of the batteries. The subsidiary connectors are connected from the batteries to a test panel, which has a plurality of pairs of test connectors. As a result, each of the batteries has its own connectors on the test panel.

DETAILED DESCRIPTION OF THE PREFERRED EMBODIMENTS

Figure 1:
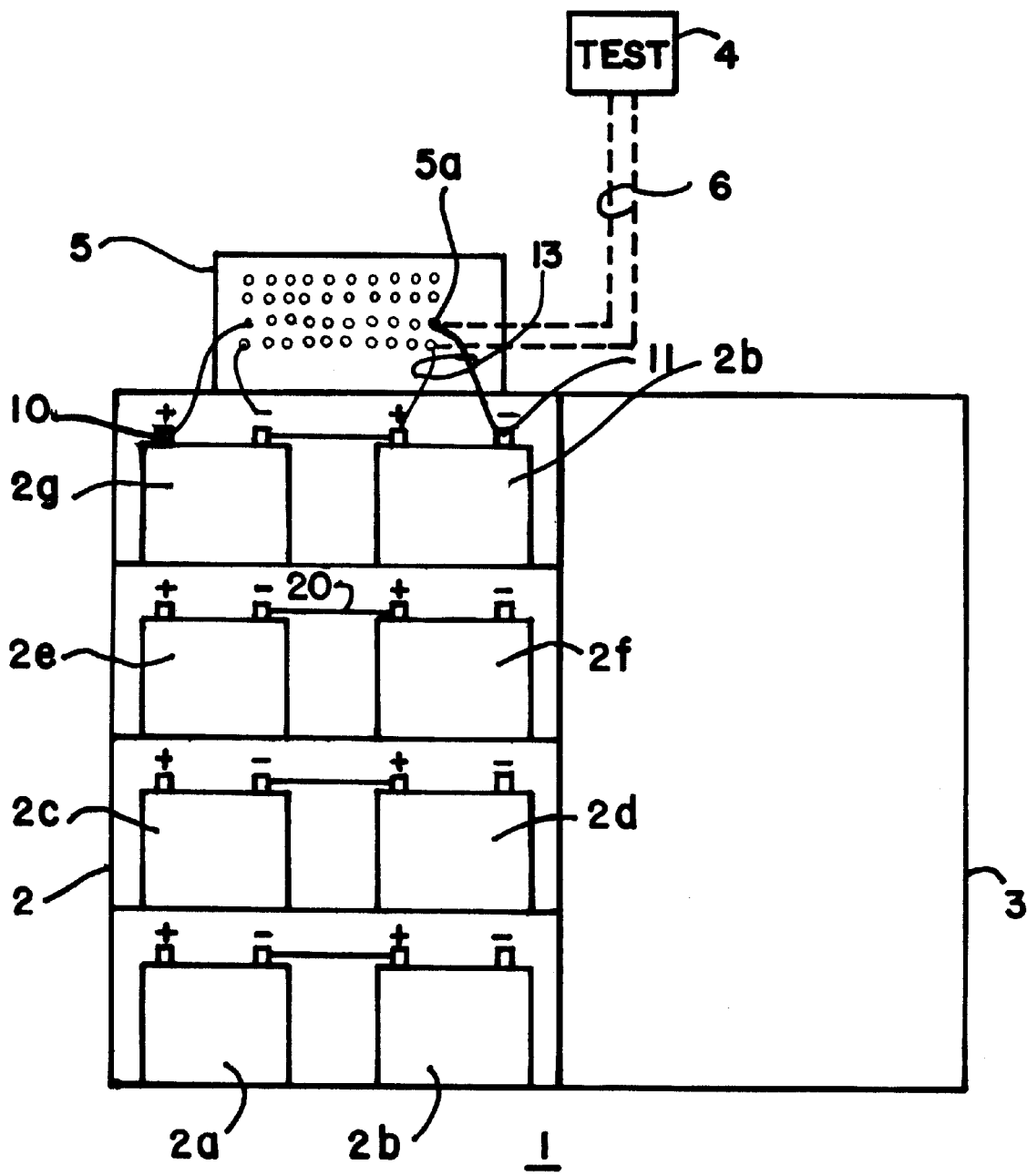
FIG. 1 is a front elevation view depicting the arrangement of batteries in a conventional battery bank and the arrangement of the present invention.

FIG. 1 depicts a standard battery bank 2 used in an uninterrupted power supply 1 (UPS). The UPS consists of an electronic element 3 that is necessary to convert the D.C. power from the battery bank 2 into AC power to maintain uninterrupted service. The battery bank 2 is constituted by any number of batteries 2(*a*)–2(*h*). Generally, there are between 2 and 40 batteries, depending upon the size of the require power loads. Each battery has a positive terminal 10 and a negative terminal 11. Normally, the batteries of the battery bank are connected together in series (from the positive terminal of one battery to the negative terminal of the next). In this manner, a sufficiently high voltage can be generated from the battery bank to satisfy the requirements of the existing load.

The present invention is constituted by a modular battery test panel 5, which can be located on top of the battery bank 2 enclosure for purposes of convenience. The test panel 5 includes a number of pairs of banana jacks, such as 5(*a*). There is a set of such jacks for each of the batteries in the battery compartment 2. The banana jacks 5(*a*) are standard low voltage (35 amp–50 amp) jacks suitable for a 12.5 volt testing device, as is commensurate with the test of a single battery. The meter or test device 4 can be of conventional design and can be connected by leads 6 to each of the banana jacks 5(*a*) corresponding to each of the batteries to be tested.

A set of subsidiary connecting leads 13 connects each battery separately to its own pair of banana jacks 5(*a*). In this manner, the test set 4 can be used to easily test the voltage and a load of up to 50 amps on each individual battery without the danger of handling the total battery bank voltage. Because relatively low voltage test connectors 5(*a*) are being used, relatively inexpensive test equipment can be used. Accordingly, the constant maintenance necessary for a UPS can be carried out without danger to the operator or interruption of the operation of the UPS. Because the power handled by subsidiary connectors 13 is far less than that handled by main connectors 20, the subsidiary leads can be much smaller than the main connectors.

While a test panel 5 is located on the top of the battery compartment of UPS 1, the test panel can be placed in any location on the casing that is considered convenient. Since the subsidiary connectors 13 are sized for low voltage and current capacity, long leads are possible and can be run though a common conduit (not shown) from the battery compartment to any location at which the test panel 5 is placed. Such locations can be on the main control panel (not shown) of the UPS 1, or at a remote location selected for convenience by the UPS system operator.

The present invention is particularly effective when used with a standard UPS. The present system provides the capability of being able to directly load test each battery with an artificial load of 50 amps for 10 seconds or longer while observing voltage drops at realistic operating conditions. All of this can be done in complete safety. The present system also provides the capability of being able to monitor a single battery or any group of multiple batteries in series. Since batteries on a UPS are arranged on shelves, any given shelf can be examined, thereby obtaining a per-shelf voltage total. With the present invention, any combination of batteries in the UPS can be easily tested in complete safety.

While the first preferred embodiment of the present invention is used with a UPS unit 1, having lead acid batteries 2(*a*)–2(*h*) operating at 12.4 volts, the present invention can be applied to virtually any other system having a bank of batteries. The UPS system is only selected by way of example because such devices always require a bank of batteries. For example, the present invention can be used with test devices that normally require a bank of batteries, which must be frequently tested in order to verify the accuracy of the test device. The present invention can be applied to virtually any device having a bank of virtually any type of batteries, operating at virtually any voltage.

While a number of embodiments of the present invention have been described by way of example, the present invention is not limited thereto. Rather, the present invention should be construed to include any and all variations, modifications, adaptations, derivations, permutations, and additional embodiments that would occur to one skilled in this art having been taught the present invention by the instant application. Accordingly, the present invention should be interpreted as being limited only by the following claims.

I claim:

1. A battery test system for a bank of lead acid batteries having at least two batteries connected together in series with main connectors, said batteries being located inside a closed battery compartment permanently connected to a load bed by said bank of batteries said test system comprising:

a) a separate set of fixed subsidiary connectors on positive and negative terminals of each said battery and permanently affixed in said battery compartment; and b) a test panel having a plurality of pairs of test connectors, each said pair of test connectors being connected to a different separate one of said sets of subsidiary connectors, said test panel being permanently affixed to said battery compartment whereby testing of individual batteries is conducted without opening said battery compartment.

2. The system of claim 1, wherein said test connectors comprise low voltage jacks adapted for connecting leads to an external voltage tester.

3. The system of claim 2, wherein said batteries are rated at substantially 12.5 volts.

4. The system of claim 3, wherein said bank of batteries is connected as part of an uninterruptible power supply (UPS).

5. The system of claim 1, wherein said test connectors are adapted for directly handling an artificial applied load of up to 50 amps for 10 seconds.

\* \* \* \* \*